(12) United States Patent
Chang et al.

(10) Patent No.: US 9,240,474 B2
(45) Date of Patent: Jan. 19, 2016

(54) ENHANCED GAN TRANSISTOR AND THE FORMING METHOD THEREOF

(71) Applicant: National Chiao Tung University, Hsinchu (TW)

(72) Inventors: Yi Chang, Hsinchu County (TW); Yueh-Chin Lin, New Taipei (TW); Huan-Chung Wang, Taichung (TW)

(73) Assignee: National Chiao Tung University, Taiwan (CN)

( * ) Notice: Subject to any disclaimer, the term of this patent is extended or adjusted under 35 U.S.C. 154(b) by 0 days.

(21) Appl. No.: 14/050,534

(22) Filed: Oct. 10, 2013

(65) Prior Publication Data

US 2014/0346523 A1 Nov. 27, 2014

(30) Foreign Application Priority Data

May 27, 2013 (TW) .............................. 102118636 A

(51) Int. Cl.
*H01L 29/778* (2006.01)
*H01L 29/66* (2006.01)
*H01L 29/20* (2006.01)

(52) U.S. Cl.
CPC ...... *H01L 29/7787* (2013.01); *H01L 29/66462* (2013.01); *H01L 29/2003* (2013.01)

(58) Field of Classification Search
None
See application file for complete search history.

(56) References Cited

U.S. PATENT DOCUMENTS

| 7,608,497 | B1 * | 10/2009 | Milosavljevic et al. ...... 438/182 |
| 2003/0203604 | A1 * | 10/2003 | Makita ........................... 438/571 |
| 2008/0149965 | A1 * | 6/2008 | Kaibara et al. ................. 257/192 |
| 2012/0049955 | A1 * | 3/2012 | Minoura ....................... 330/250 |
| 2013/0077352 | A1 * | 3/2013 | Shimizu et al. ................. 363/17 |

* cited by examiner

*Primary Examiner* — Bilkis Jahan
*Assistant Examiner* — Kevin Quinto
(74) *Attorney, Agent, or Firm* — Bacon & Thomas, PLLC

(57) ABSTRACT

An enhanced GaN transistor is provided. The structure comprises a substrate, a heterostructure, a p-element epitaxy growth layer, a drain ohmic contact and a source ohmic contact disposed on the heterostructure and on two sides of the p-element epitaxy growth layer, a gate structure disposed on the p-element epitaxy growth layer, and is separated from the drain ohmic contact and the source ohmic contact, a surface passivation layer covered the drain ohmic contact, source ohmic contact, and p-element epitaxy growth layer, and covered portion of the gate structure.

4 Claims, 5 Drawing Sheets

'Figure 3

ENHANCED GAN TRANSISTOR AND THE FORMING METHOD THEREOF

BACKGROUND OF THE INVENTION

1. Field of the Invention

The present invention related to a GaN transistor, particularly an enhanced GaN transistor with the P-N junction.

2. Description of the Prior Art

Because the gallium nitride high electron mobility transistor (GaN-HEMT) possesses higher output power, higher breakdown voltage and high-temperature resistance etc., the GaN-HEMT has been widely used in high power circuit in recent years.

As for the conventional GaN transistor, because the gallium nitride/aluminum nitride in its structure possesses a great amount of polar charge to form two dimension electron gas (2DEG), so that the transistor should be operated under the depletion mode. Under this mode, the transistor is called the normal on transistor. Because the threshold voltage of the normal on transistor is negative, the transistor will still be able to conduct the current, which may cause extra power consumption.

In the prior art, the recessed gate or carbon tetrafluoride ($CF_4$) plasma or P-type gallium nitride gate has been proposed to make the enhanced GaN transistor. In the transistor with conventional AlGaN/GaN heterostructure, its AlGaN buffer layer has some problems, such as mismatch lattice constant, thermal expansion variance and tensile strength etc. Thus, the maximum output current will be constrained.

SUMMARY OF THE INVENTION

According to the defects of the prior art, the main purpose of present invention is to use the $In_xAl_{1-x}N/AlN$ with better lattice matched (LM) heterostructure to reduce the tensile strength and keep high polarized charge density for two dimension electron gas, in order to raise the output current. Thus in the present invention, the epitaxy growth heterostructure of InxAl1-xN/AlN is used. The P-N junction is formed on the top layer by doping the p-InxAl1-xN, in order to make the enhanced GaN transistor device with higher output current.

According to the abovementioned description, another purpose of present invention is to design the normal-off GaN transistor with higher output current, which is also able to be operated under the enhancement mode, in order to improve the defects of the prior art and can further be applied in high power circuit.

One more purpose of present invention is to use the P-N semiconductor junction and the heterostructure of InxAl1-xN/AlN to make the enhanced GaN transistor. The purpose of using the P-N semiconductor junction is to use its built-in voltage to raise the threshold voltage of the transistor, so that the transistor will be able to be operated under the enhancement mode.

A further purpose of present invention is to use the heterostructure of InxAl1-xN/AlN to raise the output current, in order to improve the drain output current and the transconductance of transistor. It will be suitable for the application in high-performance and high voltage driver and control circuit system of next generation.

According to the abovementioned purpose, an enhanced GaN transistor is provided. The structure comprises a substrate, a heterostructure, a p-element epitaxy growth layer, a drain ohmic contact and a source ohmic contact disposed on the heterostructure and on two sides of the p-element epitaxy growth layer, a gate structure disposed on the p-element epitaxy growth layer, and is separated from the drain ohmic contact and the source ohmic contact, a surface passivation layer covered the drain ohmic contact, source ohmic contact, and p-element epitaxy growth layer, and covered portion of the gate structure, so that the P-N junction can be formed under the gate structure by the p-element epitaxy growth layer and heterostructure to form an enhanced GaN transistor with higher output current.

According to the abovementioned enhanced GaN transistor, the present invention also discloses the forming method of the enhanced GaN transistor, comprising: providing a substrate, forming a heterostructure on the substrate, forming a p-element epitaxy growth layer on the heterostructure, forming a first photoresist layer on the p-element epitaxy growth layer and forming a drain region and a source region on two sides of the p-element epitaxy growth layer, etching to remove portion of the p-element epitaxy growth layer, depositing a first metal layer on two sides of the p-element epitaxy growth layer to form a drain ohmic contact and a source ohmic contact, forming a second photoresist layer on the p-element epitaxy growth layer, and forming a gate region on the p-element epitaxy growth layer, depositing a second metal layer on the p-element epitaxy growth layer, etching to remove portion of the second metal layer to form a gate structure on the p-element epitaxy growth layer, separating the gate structure from the drain ohmic contact and the source ohmic contact, depositing a surface passivation layer to cover the drain ohmic contact, source ohmic contact, p-element epitaxy growth layer and portion of the gate structure, in order to form an enhanced GaN transistor with higher output current. The leakage current of gate can be reduced through the surface passivation layer to improve the performance of the transistor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
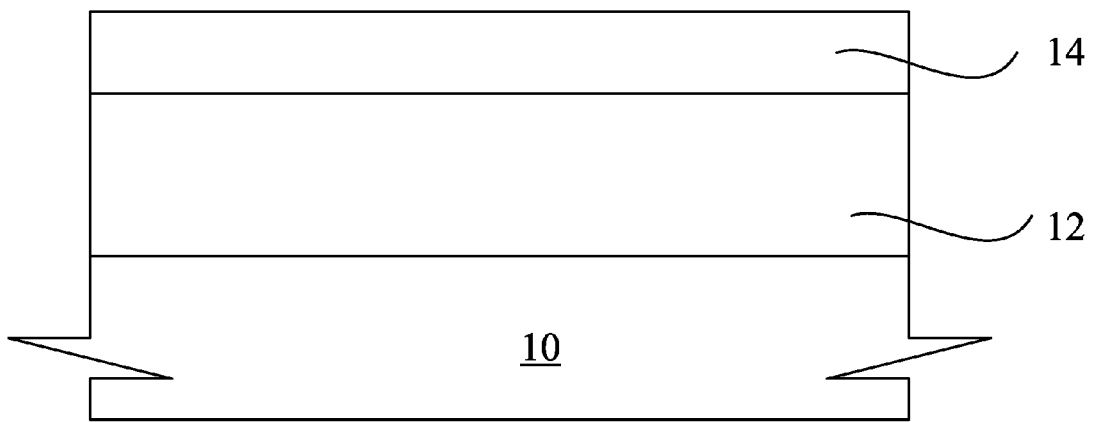
FIG. 1 illustrates the cross-sectional view of the GaN epitaxy structure.

Please refer to FIG. 1 firstly, FIG. 1 illustrates the cross-sectional view of the GaN epitaxy structure. In FIG. 1, the GaN epitaxy structure comprises a substrate 10, a heterostructure 12 and a p-element epitaxy growth layer 14.

It has to describe that the substrate 10 shown in FIG. 1 may be sapphire, silicon carbide (SiC) and silicon (Si) substrate. The heterostructure 12 may be composed of the $In_xAl_{1-x}N/AlN$. In another embodiment, the heterostructure 12 may be composed of the AlGaN/GaN. Then, a p-element epitaxy growth layer 14 is disposed on the heterostructure 12, wherein the p-element epitaxy growth layer 14 may be the p-InxAl1-xN. In addition, the GaN epitaxy structure shown in FIG. 1 may also comprises a buffer layer (not shown in Figure) disposed between the substrate 10 and the heterostructure 12.

Figure 2:
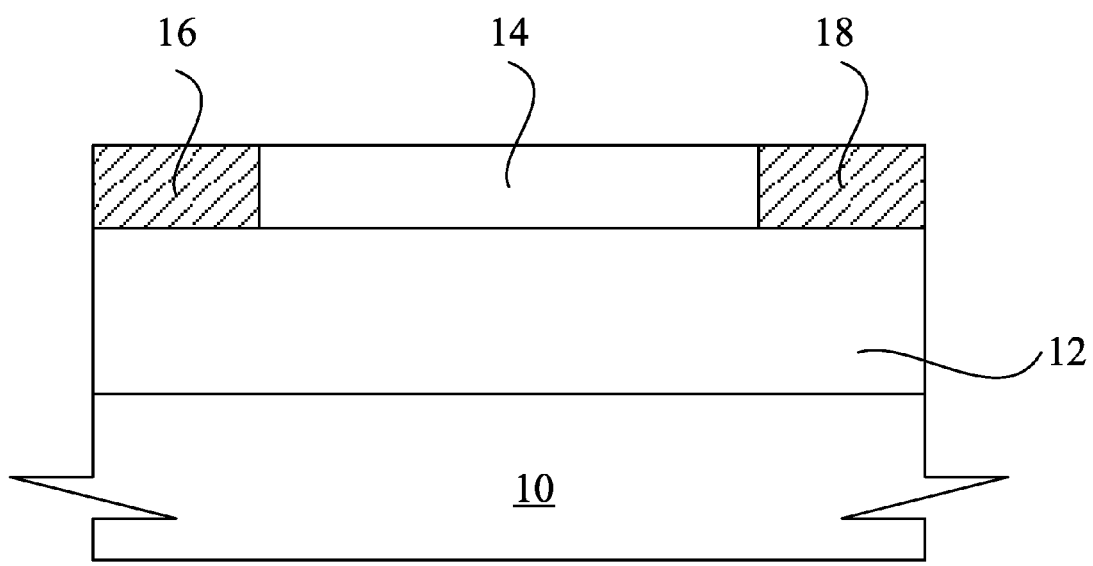
FIG. 2 illustrates the cross-sectional view of forming the drain ohmic contact and the source ohmic contact on two sides of the p-element epitaxy growth layer.

Please refer to FIG. 2 continuously. FIG. 2 illustrates the cross-sectional view of forming the drain ohmic contact and the source ohmic contact on two sides of the p-element epitaxy growth layer. In FIG. 2, a first photoresist layer (not shown in Figure) is disposed on the p-element epitaxy growth layer 14 firstly. Then, a drain region (not shown in Figure) and a source region (not shown in Figure) are defined on the p-element epitaxy growth layer 14 according to the pattern of the first photoresist layer. The etching step is used to remove portion of the p-element epitaxy growth layer 14. Then the depositing step is used to a first metal layer (not shown in Figure) to form a drain ohmic contact 16 and a source ohmic contact 18 on two sides of the p-element epitaxy growth layer 14.

Figure 3:
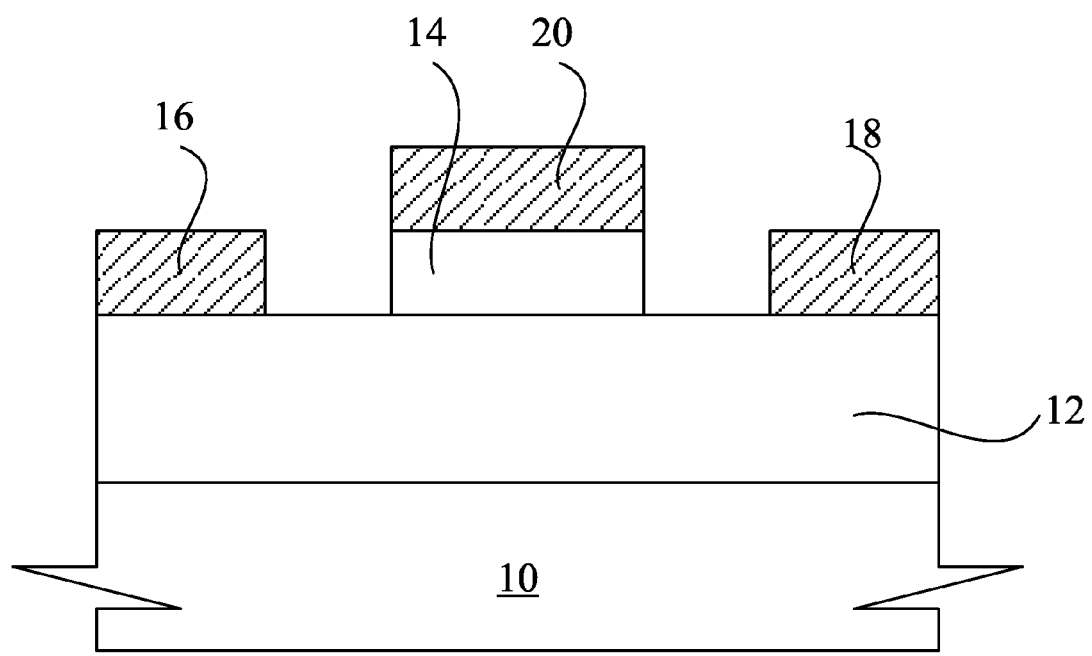
FIG. 3 illustrates the cross-sectional view of forming the gate structure on the p-element epitaxy growth layer.

Please refer to FIG. 3 then. FIG. 3 illustrates the cross-sectional view of forming the gate structure on the p-element epitaxy growth layer. In FIG. 3, a second photoresist layer (not shown in Figure) is disposed on the p-element epitaxy growth layer 14 firstly. Then, the second photoresist layer is used to define a gate region (not shown in Figure) on the p-element epitaxy growth layer 14.

Still as FIG. 3, then, a second metal layer (not shown in Figure) is deposited on the p-element epitaxy growth layer 14, drain ohmic contact 16 and source ohmic contact 18. According to the gate region defined by the second photoresist layer, the etching step is used to remove the second metal layer other than the gate region, in order to form a gate structure 20 on the p-element epitaxy growth layer 14. The gate structure 20 is separated from the drain ohmic contact 16 and the source ohmic contact 18. In this embodiment, the inductively coupled plasma (ICP) is used to remove the second metal layer other than the gate region.

In addition, in the embodiment of the present invention, the abovementioned p-element epitaxy growth layer 14 may be the p-InxAl1-xN. The InxAl1-xN possesses n-element property of electron carriers, when the p-element, such as IIA Group element, is doped, the p-InxAl1-xN will be formed to generate the P-N junction on the gate structure 20 shown in FIG. 3. Because the built-in voltage of the P-N junction is about 0.7V, the transistor can be operated under the depletion mode to form a normally-off transistor or an enhanced transistor.

Figure 4:
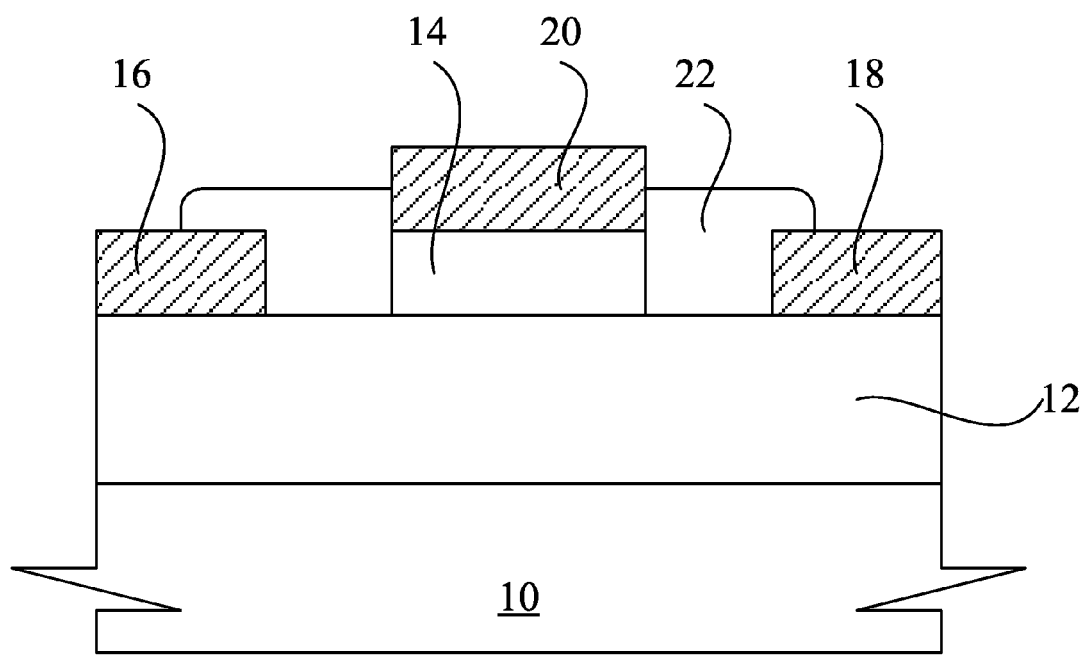
FIG. 4 illustrates the cross-sectional view of forming the surface passivation layer on the structure shown in FIG. 3.

Please refer to FIG. 4 continuously. FIG. 4 illustrates the cross-sectional view of forming the surface passivation layer on the structure shown in FIG. 3. In FIG. 4, the surface passivation layer 22 made by silicon nitride (SiN) is deposited and covered the drain ohmic contact 16 and source ohmic contact 18 on the heterostructure 12, and covered the p-element epitaxy growth layer 14 and portion of the gate structure 22 to complete the enhanced GaN transistor disclosed by the present invention. In this embodiment, the plasma enhanced chemical vapor deposition (PECVD) is used to deposit the surface passivation layer 22.

As shown in FIG. 4, the surface passivation layer 22 can reduce the defect of surface state effectively, in order to achieve the device protection effect.

Figure 5:
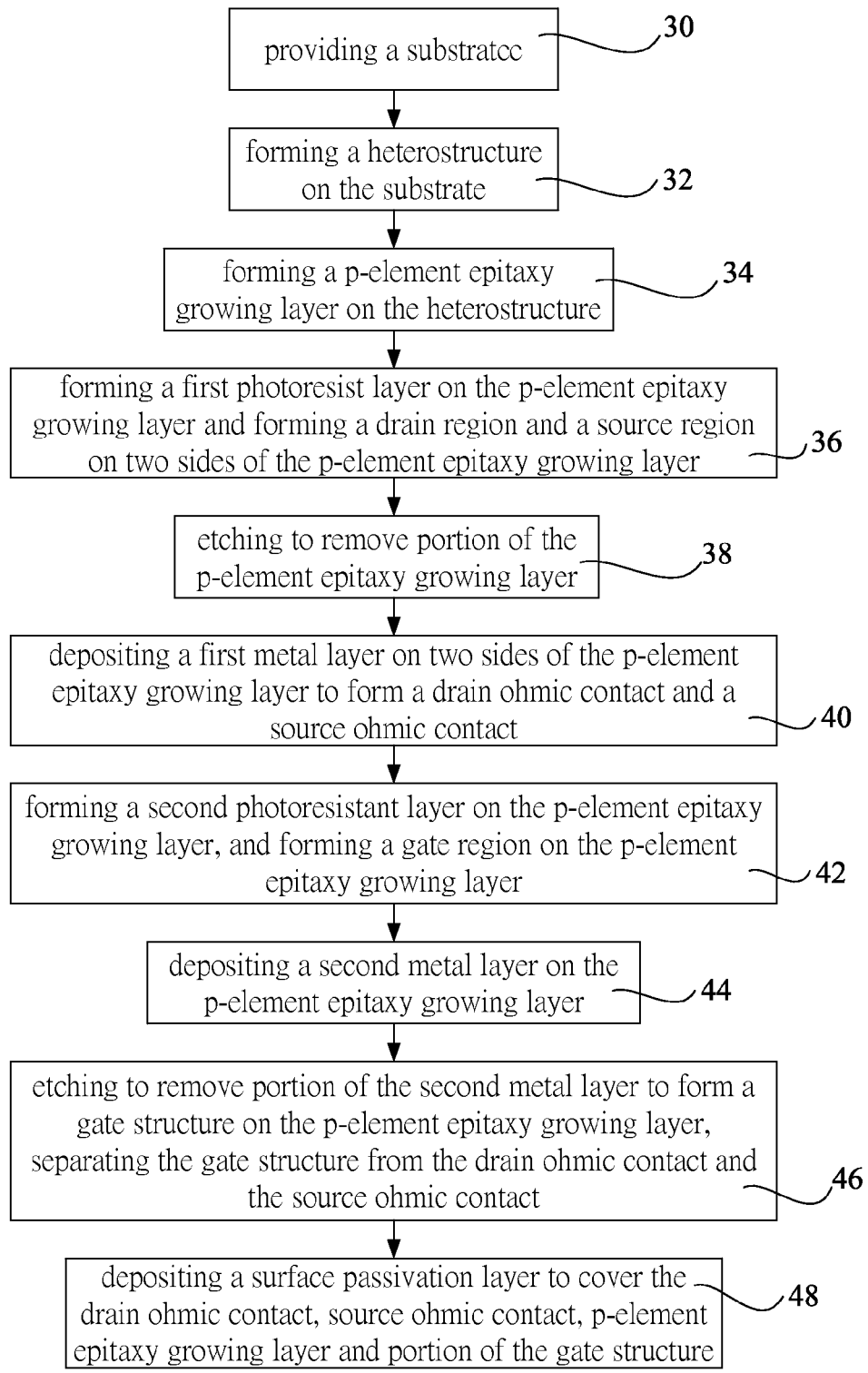
FIG. 5 illustrates the flow chart of forming the enhanced GaN transistor disclosed by the present invention.

Please refer to FIG. 5. FIG. 5 illustrates the flow chart of forming the enhanced GaN transistor disclosed by the present invention. In FIG. 5, in Step 30, a substrate is provided. In Step 32, a heterostructure is disposed on the substrate. In Step 34, a p-element epitaxy growth layer is disposed on the heterostructure. In Step 36, a first photoresist layer is disposed on the p-element epitaxy growth layer, and a drain region and a source region are defined on two sides of the p-element epitaxy growth layer region. In Step 38, the etching way is used to remove portion of the p-element epitaxy growth layer. In Step 40, a first metal layer is deposited on the drain region and the source region defined on two sides of the p-element epitaxy growth layer, in order to form a drain ohmic contact and a source ohmic contact.

Then in Step 42, a second photoresist layer is disposed on the p-element epitaxy growth layer, and a gate region is defined on the p-element epitaxy growth layer. In Step 44, a second metal layer is deposited on the p-element epitaxy growth layer. In Step 46, the etching way is used to remove portion of the second metal layer to form a gate structure on the p-element epitaxy growth layer. The gate structure is separated from the drain ohmic contact and the source ohmic contact. In this Step, the inductively coupled plasma (ICP) is used for etching. Then in Step 48, a surface passivation layer is formed to cover the drain ohmic contact, source ohmic contact, p-element epitaxy growth layer and portion of gate structure to complete the enhanced GaN transistor.

According to the abovementioned description, the main purpose of present invention is to make an enhanced GaN transistor with higher output current. The recessed gate structure made by the existing technique can be used to produce the enhanced GaN transistor for the enhanced operation. Its maximum output current is unable to be raised due to the epitaxy structure. In the enhanced GaN transistor disclosed by the present invention, the InxAl1-xN/AlN heterostructure is used to substitute the conventional AlGaN/GaN heterostructure. The P-type InxAl1-xN layer is formed on the top layer to form the P-N junction, in order to make an enhanced GaN transistor with higher output current. The leakage current of gate can be reduced through the surface passivation layer to improve the performance of the GaN transistor applied under high voltage.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An enhanced GaN transistor by having an $In_xAl_{1-x}N$/AlN heterostructure to raise an output current and having a p-$In_xAl_{1-x}N$ layer to raise a threshold voltage, comprising:

a substrate, wherein the substrate is selected from the group consisting of silicon carbide (SiC) and silicon;

a $In_xAl_{1-x}N$/AlN heterostructure being disposed on the substrate in order to raise an output current;

a p-$In_xAl_{1-x}N$ layer being disposed on the $In_xAl_{1-x}N$/AlN heterostructure to form a P-N junction in order to raise a threshold voltage;

a drain ohmic contact is disposed on the $In_xAl_{1-x}N$/AlN heterostructure, and a source ohmic contact is disposed on the $In_xAl_{1-x}N$/AlN heterostructure, formed on two sides of the p-$In_xAl_{1-x}N$ layer;

a gate structure being disposed on the p-$In_xAl_{1-x}N$ layer and separated from the drain ohmic contact and the source ohmic contact; and a surface passivation layer covers the drain ohmic contact, the source ohmic contact, the p-$In_xAl_{1-x}N$ layer and a portion of the gate structure, wherein the surface passivation layer comprises silicon nitride (SiN).

2. A forming method for the enhanced GaN transistor by having an $In_xAl_{1-x}N$/AlN heterostructure to raise an output current and having a p-$In_xAl_{1-x}N$ layer to raise a threshold voltage, comprising;
  providing a substrate, wherein the substrate is selected from the group consisting of silicon carbide (SiC) and silicon;
  forming a $In_xAl_{1-x}N$/AlN heterostructure on the substrate in order to raise an output current;
  forming a p-$In_xAl_{1-x}N$ layer on the $In_xAl_{1-x}N$/AlN heterostructure to form a P-N junction in order to raise a threshold voltage;
  forming a first photoresist layer on the p-$In_xAl_{1-x}N$ layer and forming a drain region and a source region on two sides of the p-$In_xAl_{1-x}N$ layer;
  etching to remove a portion of the p-$In_xAl_{1-x}N$ depositing a first metal layer on two sides of the p-$In_xAl_{1-x}N$ growth layer to form a drain ohmic contact and a source ohmic contact;
  forming a second photoresist layer on the p-$In_xAl_{1-x}N$ layer, and defining a gate region on the p-$In_xAl_{1-x}N$ layer;
  depositing a second metal layer on the p-$In_xAl_{1-x}N$ layer;
  etching to remove a portion of the second metal layer by using an inductively coupled plasma (ICP) to form a gate structure on the p-$In_xAl_{1-x}N$ layer, separating the gate structure from the drain ohmic contact and the source ohmic contact; and
  depositing a surface passivation layer to cover the drain ohmic contact, the source ohmic contact, the p-$In_xAl_{1-x}N$ layer and a portion of the gate structure.

3. The method according to claim 1, wherein the plasma enhanced chemical vapor deposition (PECVD) is used to deposit the surface passivation layer.

4. The method according to claim 1, wherein the surface passivation layer comprises silicon nitride (SiN).

* * * * *